United States Patent [19]
Askin et al.

[11] 3,949,383
[45] Apr. 6, 1976

[54] D. C. STABLE SEMICONDUCTOR MEMORY CELL

[75] Inventors: Haluk O. Askin, Stanfordville; Edward C. Jacobson, Poughkeepsie; James M. Lee, Poughkeepsie; George Sonoda, Poughkeepsie, all of N.Y.

[73] Assignee: IBM Corporation, Armonk, N.Y.

[22] Filed: Dec. 23, 1974

[21] Appl. No.: 535,875

[52] U.S. Cl. ............................................ 340/173 DR
[51] Int. Cl.² ..................... G11C 7/02; G11C 11/24
[58] Field of Search.... 340/173 R, 173 DR, 173 FF, 340/173 D

[56]     References Cited
         UNITED STATES PATENTS

| | | |
|---|---|---|
| 3,157,859 | 11/1964 | Moore et al.................. 340/173 DR |
| 3,161,858 | 12/1964 | Sanders et al................ 340/173 DR |
| 3,535,699 | 10/1970 | Gaensslen et al. ............ 340/173 DR |
| 3,576,571 | 4/1971 | Booher.......................... 340/173 DR |
| 3,806,898 | 4/1974 | Askin ............................ 340/173 DR |
| 3,836,894 | 9/1974 | Cricchi.......................... 340/173 DR |
| 3,868,656 | 2/1975 | Stein et al. ................... 340/173 DR |

Primary Examiner—Vincent P. Canney
Attorney, Agent, or Firm—T. E. Galanthay

[57]     ABSTRACT

Disclosed is a field effect transistor (FET) memory array in which each of the cells forming the array comprises four FET's. The first and second of the four FET devices are cross-coupled while the third and fourth FET devices form loads for the cross coupled pair. D.C. stability is achieved by conditioning the load FET devices into partial conduction during the stand-by state of the memory cell.

7 Claims, 2 Drawing Figures

D. C. STABLE SEMICONDUCTOR MEMORY CELL

CROSS REFERENCES TO RELATED APPLICATIONS AND PATENTS

1. Spampinato et al U.S. Pat. No. 3,541,530 issued on Nov. 17, 1970, and assigned to the assignee of the present invention.
2. Sonoda application Serial No. 535,464 filed on Dec. 23, 1974, concurrently with the present application.

BACKGROUND OF THE INVENTION

1. Field of the Invention

This invention relates to a D.C. stable semiconductor memory array and more particularly to such an array in which each memory cell comprises four field effect transistors.

2. Description of the Prior Art

The above mentioned Spampinato et al patent exemplifies the prior art in memory arrays having memory cells comprising four field effect transistors. Such four device cells have traditionally not been D.C. stable and therefore required periodic refreshing to prevent loss of the stored information. A number of different techniques for refreshing such non-D.C. stable memory cells were developed, however, they all lack the advantageous feature of D.C. stability as described in the present application.

SUMMARY OF THE INVENTION

Accordingly, it is a primary object of this invention to provide a D.C. stable storage cell with only four field effect transistors.

It is a further object of this invention to provide a memory array consisting of such cells;

It is a further object of this invention to provide three distinct levels of bias voltage to each of the memory cells.

In accordance with the present invention, a semiconductor memory array of four device FET cells is provided. Word lines and bit lines are arranged orthogonally in a known manner to permit accessing and sensing of information with an individual desired memory cell. Restoring means for equalizing or precharging the potential on a pair of bit lines is also provided. In addition to the foregoing, there is provided an array biasing means. In accordance with the present invention, the array bias means consists in part of several field effect transistors connected in a series feedback path between the word lines and the bit lines. The array bias means includes further transistor means to provide a bit line and word line bias at a potential level intermediate between the full logical up and down levels.

The foregoing and other objects, features, and advantages of this invention will be apparent from the following more detailed description of a preferred embodiment of the invention as illustrated in the accompanying drawings.

DETAILED DESCRIPTION

Figure 1:
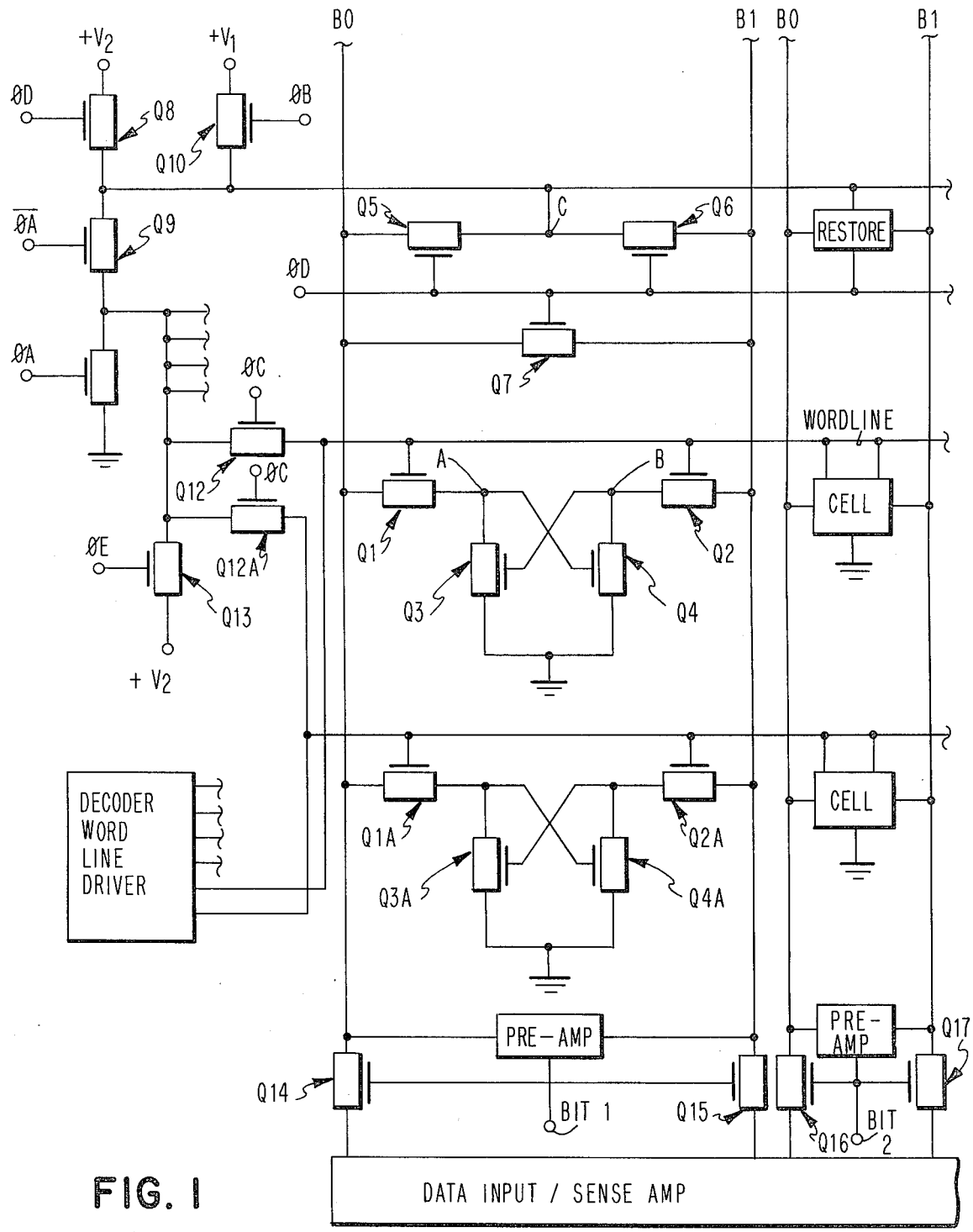
FIG. 1 is a schematic circuit diagram of the preferred embodiment.

Refer now to FIG. 1 for description of the circuit details. A matrix of four cells is shown for purposes of illustration. A typical cell includes four field effect transistors such as Q1, Q2, Q3, and Q4. Each of the field effect transistors have two gated electrodes and a gating electrode. Transistors Q3 and Q4 have a gated and gating electrode of one respectively connected to a gating and gated electrode of the other forming a cross coupled pair; the other of the gated electrodes of each of said transistors being connected to a fixed potential such as ground. Devices Q1 and Q2 are load devices connected in series between the internal cell nodes A and B and the associated bit line B0 and B1, respectively. A similar cell is shown consisting of transistors Q1A, Q2A, Q3A, and Q4A. Two other cells are illustrated merely as block diagrams to complete the four cell matrix or array. Those skilled in the art will understand that in practice numerous such cells compose an array and the number illustrated here has been limited merely for ease of illustration.

The restoring means for equalizing or precharging the bit lines consists of transistors Q5, Q6, and Q7. The gating electrodes of each of said transistors is connected together and adapted to receive a pulse signal on terminal phase D. The gated electrodes of Q7 are connected in series between the two bit lines providing equalization of potential. Transistors Q5 and Q6 are connected in a series path with each other between the two bit lines and receive a potential at a common point between them for application equally to the two bit lines. The potential at this common point designated as node C will either be a full binary 1 or 0 level or at a third intermediate level during standby. The appropriate desired potential levels are provided by the transistors Q8 through Q13.

The connection of these last mentioned transistors will now be described. Transistor Q10 has its gated electrodes connected in a series path between a first fixed potential +V1 and node C. In the N channel MOSFET technology assumed for the purposes of the present illustrative example, +V1 is typically +8.5 volts representing a full logical up level. Transistors Q8, Q9, and Q11 are connected in series between a second fixed potential (ground representing a full logical down level) and a third fixed potential +V2 (representing an intermediate potential of +2 to +3 volts). The intermediate point between transistors Q8 and Q9 is also connected to node C as illustrated. The common point between Q9 and Q11 is connected to a plurality of word line isolation transistors such as Q12 and Q12A. Transistor Q13 is connected between the same common point and the third fixed potential +V2. Each of the word lines is also connected to a decoder/word line driver permitting individual accessing of any one word line. Each of the bit lines is further connected to a gated electrode of a field effect transistor such as Q14, Q15, Q16, or Q17. The gating electrode of each of said transistors is connected to a bit decoder output terminal such as BIT 1, BIT 2, etc. The other of the gated electrodes of each of said transistors is connected to a data input or a sense amplifier depending on whether a write or read operation is desired. Lastly, a preamplifier is connected between the two bit lines so that in the read mode, the difference between the potential on lines B0 and B1 is amplified prior to transmission to the sense amplifier.

Figure 2:
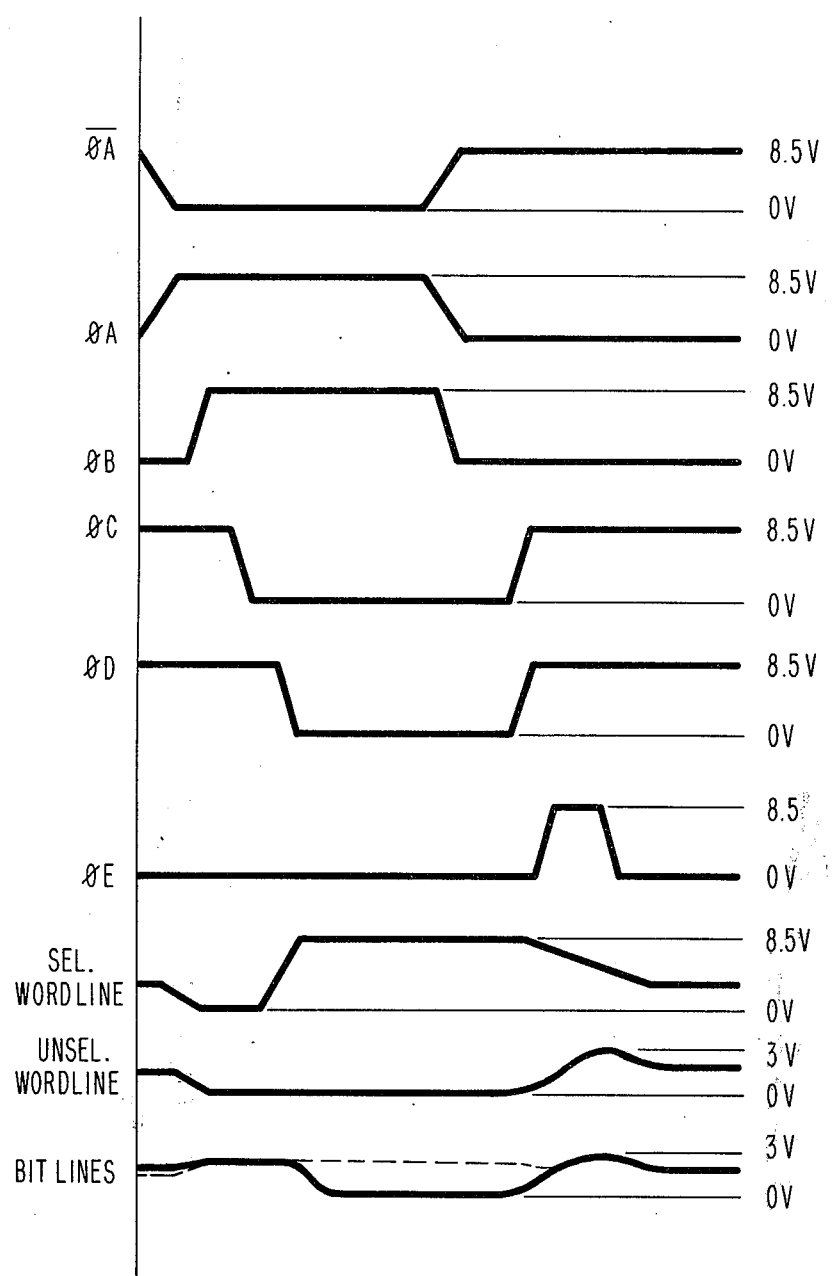
FIG. 2 is a series of waveform diagrams depicting the operation of the circuit of FIG. 1.

In operation, the array operates in a D.C. stable mode, in response to the application of various timing pulses to the various gating electrodes as illustrated in FIGS. 1 and 2. During stand-by the phase A pulse is down, the not phase A pulse is up, the phase D pulse is up, the phase C pulse is up, the phase B pulse is down and the phase E pulse is down. This provides a series path from the third fixed potential +V2 through Q8, Q9, and Q12, Q12A, etc., such that the word line is at an intermediate level of 2 to 3 volts. Note that Q8 is structurally arranged to have a width to length ratio (W/L) that is one eighth that of the other devices limiting current flow therethrough. Note also that node C is also connected to +V2 through Q8 and since devices Q5 and Q6 are also on, the load current of the cells is supplied through the bit lines. This current is sufficient to maintain the appropriate cell node (A or B) at an up level while the other of the two nodes is maintained at a down level. It is a significant feature of this invention that the stand-by power of the array is limited by the feedback path including Q9 which joins node C (which is connected to the bit lines through Q5 and Q6) to the word line (through one of transistors Q12, Q12A, etc.). As the potential of one of the word lines rises, the conductance of load devices such as Q1 and Q2 is increased drawing more current from the bit line in the path from +V2 through Q8 and Q5 and Q6. As more current is drawn through Q8, the potential at node C becomes lower, the feedback path thereby clamping the voltage on the word line to the lowered potential. This technique permits information to be retained in the cells indefinitely with minimum power dissipation.

The stand-by bit line voltage, clamped by the above mentioned feedback path is too low for operating the FET array in the read and write mode. Device 10 is therefore added to permit raising the bit line voltage prior to either a read or write operation. When a particular word line is selected, Q10 is turned on by the phase B timing pulse. Initially, the phase D timing pulse is also maintained in an up level permitting current through device 8 to also charge the bit lines. However, device 10 is designed to be approximately 8 times the width to length (W/L) ratio of device 8 such that the majority of the current used in raising the bit line voltage is supplied by device 10.

Upon selection of the particular semiconductor chip into which the disclosed array is formed, all word lines are discharged to ground. This is accomplished by turning the device Q11 on by bringing the phase A pulse to an up level, the not phase A pulse correspondingly turning device Q9 off. The phase C pulse also being on provides a direct path to ground for all the word lines. The bit line restore devices Q5, Q6, and Q7 are permitted to remain on for some time to equalize the different potential on the bit lines created by the load current of the cell. After the bit lines are equalized, the bit line restore devices (Q5, Q6, Q7) are switched off by bringing phase D to a down level and the selected word line is raised to the +V1 potential. Assuming that the word line connected to the illustrated cell including transistors Q1, Q2, Q3, and Q4 is to be selected, the decoder/word line driver will bring the word line to which it is connected to this up level. Devices Q1 and Q2 will be turned fully on providing a differential voltage on bit lines B0 and B1 that is the same relative up and down level as stored on internal nodes A and B. The preamp will accelerate bringing this difference potential to full logic level. At this point one of a plurality of bit switch signals is applied to a terminal such as BIT 1 or BIT 2, and will gate out the information from the cell. For example, in accessing the cell consisting of transistors Q1, Q2, Q3, and Q4, the BIT 1 bit switch turns on transistors Q14 and Q15 permitting the differential potential on lines B0 and B1 to be sensed by the sense amplifier. In the alternative, if it is desired to alter the information on the cell by writing, then the differential data input is applied to the bit line through transistors Q14 and Q15 setting the cross coupled transistors Q3 and Q4 into the desired one of the possible two binary states. Note that all other word lines such as the word line connected to the cell including transistors Q1A, Q2A, Q3A, and Q4A are clamped to ground by a down level output from the decoder/word line driver. The phase C pulse is also brought to a down level turning transistors Q12, Q12A, etc., off isolating the word lines from each other. Also note that during select, Q9 is turned off by the not phase A pulse further isolating the word lines from the bit lines.

As a further feature of the present invention note the presence of boosting transistor Q13 connected between +V2 and the word line through one of transistors Q12, Q12A, etc. Following every select cycle, the phase E pulse turns transistor Q13 on while phase pulse C turns the corresponding transistor Q12 on. This permits current to flow into the word line permitting load devices such as Q1 and Q2 to turn on harder than is possible by the current path through Q8 alone. At substantially the same time, the phase D pulse turns on transistors Q5, Q6, Q7, and Q8 providing a current to replenish the potential of the appropriate internal cell node (A or B) that might have leaked away during the time the load devices of the unselected cells were completely turned off.

The details of the just described timing operations are shown in the waveform diagrams of FIG. 2. These various timing waveforms are generated by field effect transistor circuits formed on the same semiconductor chip with the memory cells. The details of these timing circuits are not shown since it is well known to provide timing waveforms in any sequence with field effect transistors formed on a semiconductor chip.

While the invention has been shown and particularly described with reference to preferred embodiments, it will be understood by those skilled in the art that various changes in form and detail may be made therein without departing from the spirit and scope of the invention.

What is claimed is:

1. An array of semiconductor memory cells formed in a semiconductor substrate each one of said memory cells including four devices, the first and second of the four devices being cross-coupled while the third and fourth devices form loads for the cross-coupled pair, said array further comprising:

a plurality of word lines arranged in parallel with each other each connected to a plurality of said cells arranged in a row;

a plurality of bit lines, parallel to each other, arranged orthogonally to said word lines, a pair of said bit lines being operatively associated with each cell in a column of cells;

means for selecting one of said plurality of word lines and a pair of said bit lines;

means for applying first and second fixed potentials to one row of said cells while simultaneously applying only said second fixed potential to all other cells in said array when said one row of cells is desired to be accessed; and bias means for applying a third potential to all of said cells in said array when none of said cells are desired to be accessed, said third potential being intermediate in value between said first and second fixed potentials, said bias means including means for regulating said third potential to minimize power dissipation.

2. An array of semiconductor memory cells as in claim 1 wherein said bias means forms a conductive path between said word lines and said bit lines.

3. An array of semiconductor memory cells as in claim 1 further comprising:

restore means connected between each said pair of bit lines.

4. An array of semiconductor memory cells as in claim 1 further comprising:

word line isolation means connected between each said word lines and said bias means.

5. An array of semiconductor memory cells as in claim 1 further comprising:

preamplifier means connected between each said pair of bit lines.

6. An array of semiconductor memory cells as in claim 1 wherein said bias means includes a field effect transistor having a gating electrode and two gated electrodes, one of said gated electrodes being connected to a fixed potential intermediate said first and second fixed potential, said last mentioned transistor having a higher impedance than any other transistor forming said bias means.

7. An array of semiconductor memory cells as in claim 1 further comprising:

voltage boosting means connected in a series path between each word line and one of said fixed potentials.

* * * * *